(12) United States Patent
Langhammer et al.

(10) Patent No.: US 12,743,119 B2
(45) Date of Patent: Sep. 22, 2026

(54) POWER SAVINGS BY REGISTER INSERTION IN LARGE COMBINATIONAL CIRCUITS

(71) Applicant: Altera Corporation, San Jose, CA (US)

(72) Inventors: Martin Langhammer, Alderbury (GB); Gregg William Baeckler, San Jose, CA (US); Sergey Vladimirovich Gribok, Santa Clara, CA (US); Mahesh A. Iyer, Fremont, CA (US)

(73) Assignee: Altera Corporation, San Jose, CA (US)

(*) Notice: Subject to any disclaimer, the term of this patent is extended or adjusted under 35 U.S.C. 154(b) by 143 days.

(21) Appl. No.: 17/957,235

(22) Filed: Sep. 30, 2022

(65) Prior Publication Data

US 2023/0027064 A1 Jan. 26, 2023

(51) Int. Cl.

| | |
|---|---|
| ***G06F 1/06*** | (2006.01) |
| ***G06F 1/32*** | (2019.01) |
| ***G06F 1/3237*** | (2019.01) |
| ***H03K 19/00*** | (2006.01) |

(52) U.S. Cl.

CPC .............. *G06F 1/06* (2013.01); *G06F 1/3237* (2013.01); *H03K 19/0016* (2013.01); *G06F 1/32* (2013.01)

(58) Field of Classification Search

CPC ...... G06F 1/06; G06F 1/3237; H03K 19/0016

See application file for complete search history.

(56) References Cited

U.S. PATENT DOCUMENTS

| | | | | |
|---|---|---|---|---|
| 2010/0259308 A1* | 10/2010 | Wang | G06F 1/04 | 327/175 |
| 2013/0318384 A1* | 11/2013 | Yoshihara | G06F 1/3203 | 713/323 |
| 2016/0065213 A1* | 3/2016 | Patil | H03K 19/1774 | 326/38 |
| 2023/0141475 A1* | 5/2023 | Li | G06F 1/3296 | 713/320 |

* cited by examiner

*Primary Examiner* — Terrell S Johnson
(74) *Attorney, Agent, or Firm* — Fletcher Yoder, P.C.

(57) ABSTRACT

Systems and methods of the present disclosure provide techniques for reducing power consumption of a large combinational circuit using register insertion. In particular, a large circuit may be analyzed to determine the amount of signal switching at various logical points (e.g., stages in the computation) of the circuit. A clock sequence with many pulses in the period of a clock that runs the large combinatorial circuit may be generated. To balance the amount of signal switching at various logical points in the circuit, registers may be inserted at certain points in the large circuit with the clock pulses of the clock sequence assigned to the registers that may not have a constant frequency or may be phase shifted versions of the main clock.

20 Claims, 4 Drawing Sheets

70
72
74
76

70
72
72A
72B
72C
72D
78
78
78
74
76

80
82 clk
clk1
clk2
clk3
80
84, 84A
84, 84B
84, 84C
100
102
104
106
108
110
112
114

72
80
clk
clk1
clk2
clk3
76
72, 72A
72, 72B
72, 72C
72, 72D
84, 84A
84, 84B
84, 84C
78, 78A
78, 78B
78, 78C

POWER SAVINGS BY REGISTER INSERTION IN LARGE COMBINATIONAL CIRCUITS

BACKGROUND

The present disclosure relates generally to integrated circuit (IC) devices such as programmable logic devices (PLDs). Particularly, the present disclosure relates to reducing dynamic power consumption in large combinational circuits by register insertion.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

As cryptographic and blockchain applications become increasingly prevalent, integrated circuits are increasingly used in computation of very large combinational functions. For example, in a single cycle of such a large function, a signal may pass though on the order of hundred thousand arithmetic logic modules (ALMs). In addition, the computation in such a function may include on the order of a thousand bits. Computation of the products of such large combinational functions may consume significant amounts of dynamic power as logic circuits change states before settling.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
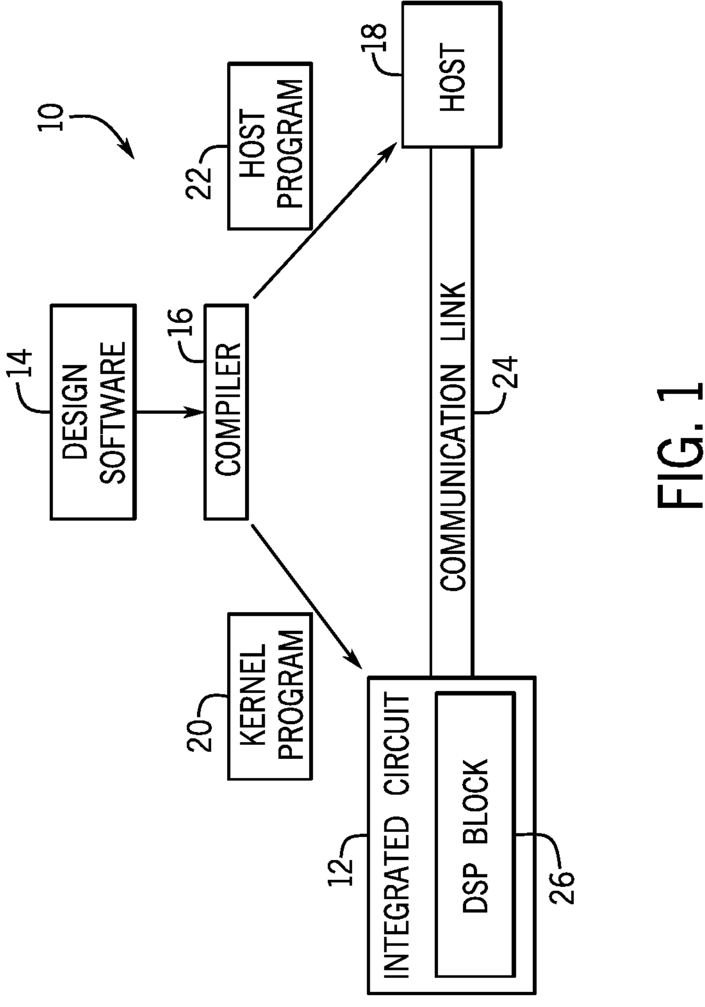
FIG. 1 illustrates a block diagram of a system that may implement arithmetic operations using a digital signal processing (DSP) block, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As cryptographic and blockchain applications become ever more prevalent, there is a growing desire for circuitry to perform very large combinational computations. The logic circuitry associated with the large combinational computations may be large and complex (e.g., involving thousands of bits and arithmetic logic modules) and, therefore, may have relatively long signal propagation times (e.g., on the order of 100 nanoseconds). In addition, such large combinational logic circuitry (e.g., logic circuitry associated with large combinational computations) may have relatively high dynamic power consumption due to a large number of logic gate transitions, signals toggling, and capacitive loads charging and discharging involved in the computation. The present disclosure describes techniques for reducing power consumption of a large combinational circuit using register insertion. In particular, a large combinational circuit may be analyzed to determine both the amount of signal switching (e.g., toggling, oscillating) at various logical points (e.g., stages in the computation) in the large circuit. A clock sequence with many pulses in the period of the main clock (e.g., a clock that runs the large combinational circuit) may be generated. To balance the amount of signal switching at various logical points (e.g., computational stages) in the circuit, registers may be inserted at certain points in the large circuit and the clock pulses of the clock sequence may be assigned to the registers. This way, for example, the signal in the later portions of the circuit may not begin to switch until the signals from the earlier portion of the circuit are aligned (e.g., stable). Lower numbers of gate transitions and/or signal switching may generally reduce the power consumption of a system. Thus, register insertion at certain logic stages in the circuit may reduce the power consumption of the large combinational circuit.

With this in mind, FIG. 1 illustrates a block diagram of a system 10 that may implement arithmetic operations using a digital signal processing (DSP) block. A designer may desire to implement functionality, such as, but not limited to, computation of cryptographic functions, on an integrated circuit device 12 (such as a field-programmable gate array (FPGA) or an application-specific integrated circuit (ASIC)). In some cases, the designer may specify a high-level program to be implemented, such as an OpenCL program, which may enable the designer to more efficiently and easily provide programming instructions to configure a set of programmable logic cells for the integrated circuit device 12 without specific knowledge of low-level hardware description languages (e.g., Verilog or VHDL). For example, because OpenCL is quite similar to other high-level programming languages, such as C++, designers of programmable logic familiar with such programming languages may have a reduced learning curve than designers that are required to learn unfamiliar low-level hardware description languages to implement new functionalities in the integrated circuit device 12.

The designers may implement their high-level designs using design software 14, such as a version of Intel® Quartus® by INTEL CORPORATION. The design software 14 may use a compiler 16 to convert the high-level program into a lower-level description. The compiler 16 may provide machine-readable instructions representative of the high-level program to a host 18 and the integrated circuit device 12. The host 18 may receive a host program 22 which may be implemented by the kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of one or more DSP blocks 26 on the integrated circuit device 12. The DSP block 26 may include circuitry to implement, for example, operations to perform matrix-matrix or matrix-vector multiplication for AI or non-AI data processing. The integrated circuit device 12 may include many (e.g., hundreds or thousands) of the DSP blocks 26. Additionally, DSP blocks 26 may be communicatively coupled to another such that data outputted from one DSP block 26 may be provided to other DSP blocks 26.

While the techniques above discussion described to the application of a high-level program, in some embodiments, the designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
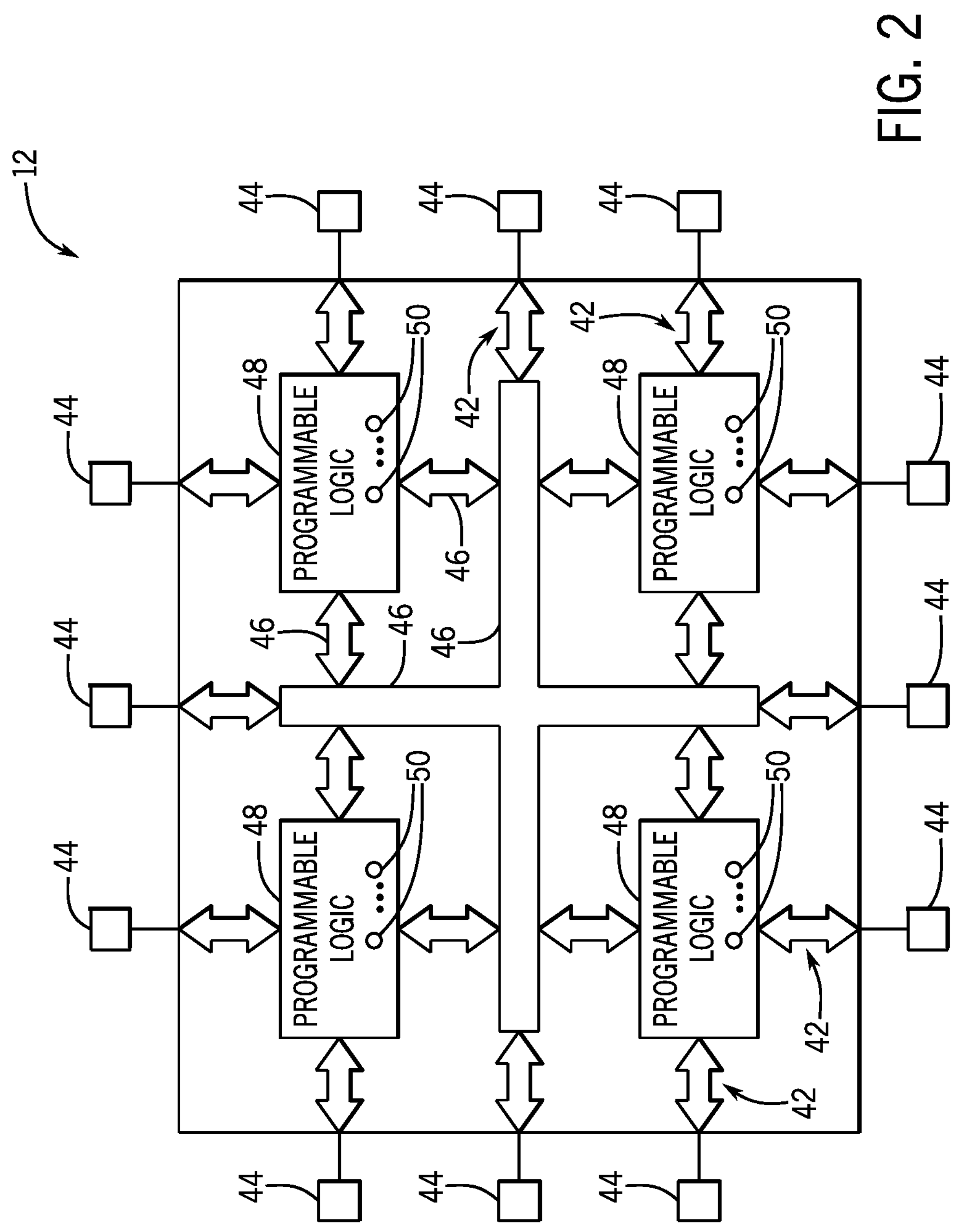
FIG. 2 illustrates an example of the integrated circuit device as a programmable logic device, such as a field-programmable gate array (FPGA), in accordance with an embodiment of the present disclosure.

Turning now to a more detailed discussion of the integrated circuit device 12, FIG. 2 illustrates an example of the integrated circuit device 12 as a programmable logic device, such as a field-programmable gate array (FPGA). Further, it should be understood that the integrated circuit device 12 may be any other suitable type of integrated circuit device (e.g., an application-specific integrated circuit and/or application-specific standard product). As shown, the integrated circuit device 12 may have input/output circuitry 42 for driving signals off device and for receiving signals from other devices via input/output pins 44. Interconnection resources 46, such as global and local vertical and horizontal conductive lines and buses, may be used to route signals on integrated circuit device 12. Additionally, interconnection resources 46 may include fixed interconnects (conductive lines) and programmable interconnects (e.g., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of the programmable logic 48.

Programmable logic devices, such as integrated circuit device 12, may contain programmable elements 50 within the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using pins 44 and input/output circuitry 42. In one embodiment, the memory cells may be implemented as random-access-memory (RAM) cells. The use of memory cells based on RAM technology is described herein is intended to be only one example. Further, because these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Keeping the foregoing in mind, the DSP block 26 along with programmable logic 48 discussed herein may be used to perform many different operations associated with the cryptographic and blockchain applications. Thus, the large combinational circuits (also referred to herein as logic circuits) used for such applications may include embedded DSP blocks 26 and/or programmable logic 48.

Figures 3, 4, 5:
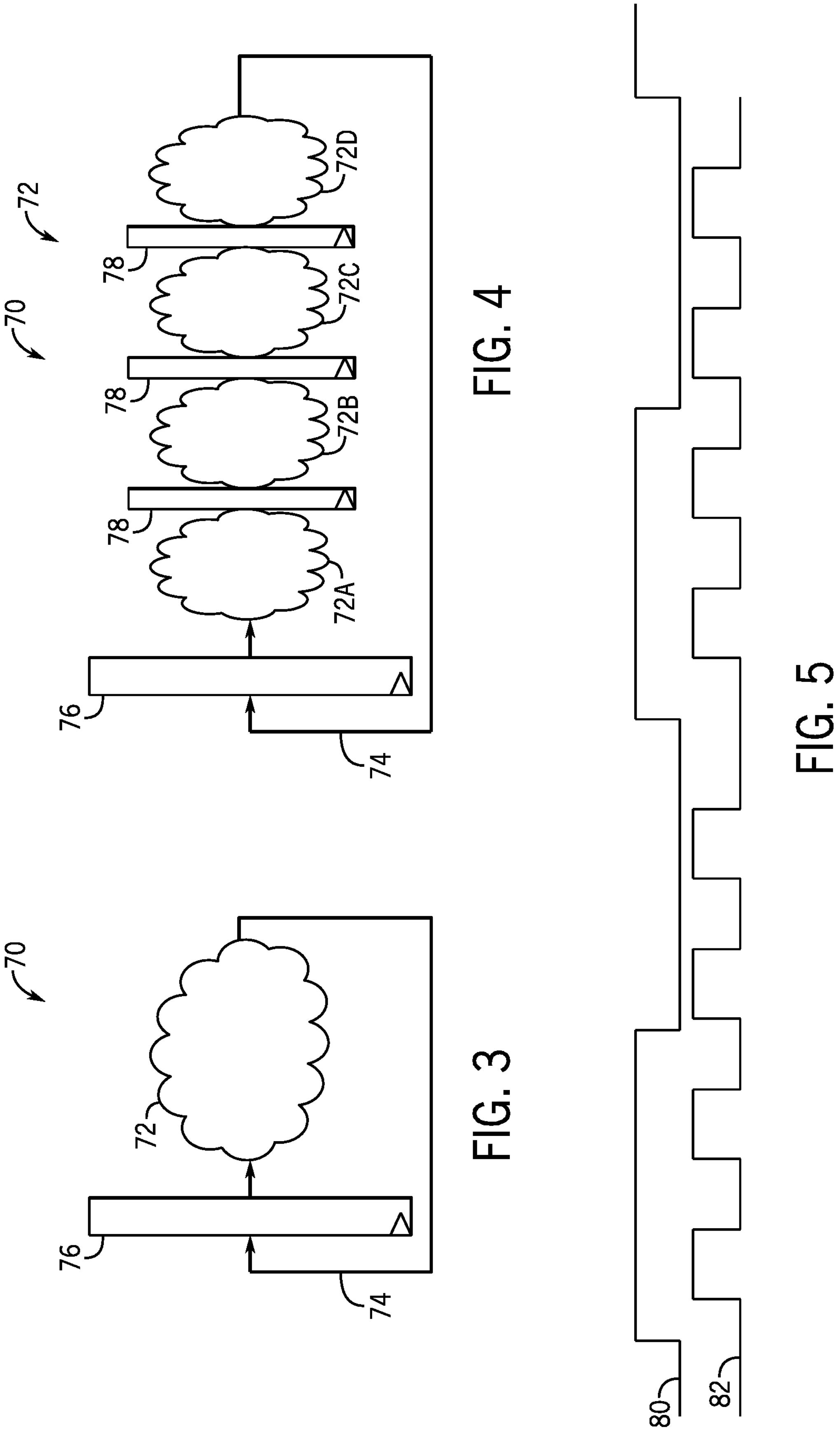
FIG. 3 is a block diagram of a function including a logic circuit such as a large combinational logic circuit, in accordance with an embodiment of the present disclosure.
FIG. 4 is a block diagram of the function including a logic circuit with inserted registers that may run on a faster clock, in accordance with an embodiment of the present disclosure.
FIG. 5 is an illustration of a main clock of the logic circuit and the faster clock used by the registers inserted in the logic circuit, in accordance with an embodiment of the present disclosure.

With the foregoing in mind, FIG. 3 is a block diagram of a function 70 including a logic circuit 72 such as a large combinational logic circuit 72. As discussed, the function 70 may be a cryptographic function and the logic circuit 72 may be a large combinational (e.g., a circuit where the output is a function of the present input only rather than a function of the present input and the history of the input) circuit including thousands of lookup tables (LUT) and involve computation of thousands of bits. As indicated by the arrow 74, the function 70 is iterative meaning that the output of the logic circuit 72 may be latched by a main register 76 in one iteration and provided as input to the logic circuit 72 in the next iteration. The main register 76 may latch the output of the logic circuit 72 based on a clock signal input from a main clock. It should be appreciated that due to signal propagation delay, a single iteration of the function 70 or a single instance of the signal propagating though the logic circuit 72 may take a certain amount of time that may correspond to one clock cycle (e.g., clock period) of the main clock. For large combinational circuits, one clock cycle may take on the order of 100 nanoseconds (ns) to compute. During this time, while the signal is propagating, the result (e.g., output value) of the computation associated with the logic circuit 72 may be unstable (e.g., due to gate transitions, signal switching, etc.). However, at the end of the clock cycle, the result may be stable.

Accordingly, when analyzed at an intermediate point in the computation (e.g., an intermediate logic point), an intermediate result of the computation associated with the logic circuit 72 may have large variations. For example, in an adder tree comprising ripple carry adders and performing addition with high precision, intermediate value will have very large differences in the arrival time between the least significant bits and the most significant bits. Such variation in the intermediate value may correspond signals toggling and capacitive loads charging and discharging in the logic circuit 72, which may consume dynamic power.

Inserting a register (e.g., a pipeline register), for example, in the middle logic circuit 72 may decrease the dynamic power consumption of the logic circuit 72 due to second half of the logic circuit 72 only operating for 50% of the clock period, rather than all of the clock period. For example, if a very large combinational logic circuit 72 that runs at a clock frequency of 10 Megahertz (MHz) or has a 100 nanosecond (ns) clock period is "bisected" by an inserted register such that an intermediate result of the logic circuit 72 is latched on a negative clock edge of the main clock, there may be an absence of switching of the bits in the second half of the circuit during the first half of the clock period, which would significantly reduce power consumption. Similarly, there also there may be an absence of switching of the bits in the first half of the circuit during the second half of the clock period, which also reduces power consumption.

The register operation may slightly increase the power consumption, but it is expected to be less than the power reduction associated with the register insertion. For example, if a large combinational logic circuit 72 that includes 100 thousand LUTs with an average of 1000 bit operations has an intermediate result latched by inserted registers on the negative edge of the main clock, the 1000 registers would switch once every 100 ns, but 50 thousand LUTs would not be switching for 50 ns. Without the inserted registers, a portion of the 50 thousand LUTs would be switching and consuming dynamic power.

As demonstrated by the examples, inserting a register at an intermediate point in the logic circuit 72 may reduce the dynamic power consumption of the logic circuit 72 by "turning off" (e.g., preventing power consumption in) a portion of the logic circuit 72 for a portion of the clock period of the main clock. It should be understood that more than one register may be inserted into the logic circuit 72 and the latching of the intermediate result may not necessarily occur on the negative clock edge in the middle of the clock cycle. In an embodiment, a faster clock with a higher frequency (e.g., than the frequency of the main clock) may be generated such that several pulses of the faster clock may occur during one period of the main clock. Registers may be inserted at various points in the logic circuit 72, and clock pulses of the faster clock may be assigned to different registers to balance the amount of switching in later portions of the circuit. Thus, the later portions of the logic circuit 72 may not start switching until more of the signals from the earlier portion of the circuit are stable.

FIG. 4 is a block diagram of the function 70 including a logic circuit 72 with inserted registers 78 that may run on a faster clock. It should be appreciated hereafter logic circuit 72 may refer to the logic circuit 72 with additional registers 78 inserted. Accordingly, the logic circuit 72 may include portions (e.g., first portion 72A, second portion 72B, third portion 72C, fourth portion 72D) of the unpipelined (e.g., without additional registers 78) logic circuit 72 shown in FIG. 3. As discussed, the function 70 may be iterative meaning that the output of the logic circuit 72 may be latched by a main register 76 in one iteration and provided as input to the logic circuit 72 in the next iteration. In an embodiment, the function 70 may be recursive. The main register 76 may latch the output of the logic circuit 72 on a clock signal input from a main clock. Meanwhile the registers 78 (e.g., pipeline registers) may latch the intermediate results of the logic circuit 72 on arrival of a pulse from the faster clock. FIG. 5 is an illustration of a main clock 80 of the logic circuit 72 and a faster clock 82 used by the registers 78 inserted in the logic circuit 72.

Although the registers 78 inserted into the logic circuit 72 may operate at a very high clock rate (e.g., clock frequency of the faster clock 82 may be high), the overall function 70 may operate on a much slower rate of the main clock 80. Moreover, while registers 78 may be inserted into logic circuit 72, they may be primary used to ensure stability of the signal in the later portions (e.g., stages) of the logic circuit 72 that are not being actively processed. Thus, despite including registers (e.g., pipeline registers), the logic circuit 72 may act as a combinational circuit where the computation associated with the different portions of the logic circuit 72 happens sequentially rather than in parallel.

It should be appreciated the faster clocks 82 may not be derived directly from the main clock 80. In an embodiment, the clock periods of the faster clock 82 and the main clock 80 may be different. In another embodiment, a pulse sequence of the faster clock 82 may repeat with the period of the main clock 80 (e.g., the pulse sequence of the faster clock 82 and the main clock 80 may have the same period). In an embodiment, the logic circuit 72 may have several faster clocks 82. In particular, different faster clocks 82 may have different duty cycles (e.g., ratio of pulse width to period of the clock) but may each have at least one edge (e.g., pulse edge) that aligns (e.g., occurs simultaneously) with an edge of another faster clock 82 and/or with an edge of the main clock 100. In an embodiment, one or more faster clocks 82 may have a pulse pattern, frequency, and/or duty cycle that vary (e.g., are non-uniform, discontinuous) throughout each clock cycle (e.g., period) of the main clock 100 and/or align with the main clock 100 on at least one edge during each clock cycle of the main clock 100. For example, while the main clock 80 may have a 100 ns clock period that includes '0' value for 50 ns and '1' value for 50 ns, the faster clock 82 may have the following pulse pattern: '0' for 10 ns, '1' for 10 ns, '0' for 20 ns, '1' for 10 ns, '0' for 15 ns, '1' for 10 ns, '0' for 15 ns, '1' for 10 ns. For example, if evenly divisible (e.g., without a remainder) logic depth stopped at an arithmetic width of 2000 bits but a small amount of additional logic depth later along the signal propagation path the arithmetic width was 1000 bits, the clock pulse may be stretched and/or delayed to group the evenly divisible logic depth and the additional logic depth into a single register stage to reduce the number of registers 78 switching. Because the main clock 80 is relatively slow, the internal clock pattern can easily be synthesized to a fine granularity compared to the main clock 80.

In an embodiment, a register 78 may be inserted into a logic circuit 72 such that it splits the datapath associated with the logic circuit 72 into portions. For example, in the logic circuit 72, which may be a large ripple carry adder, lower order (e.g., most significant) bits may be stable long before the upper order (e.g., least significant) bits. The lower order bits (e.g., the lower 50% of order) may be latched by a register 78 and the upper order bits run be computed combinationally. In practice, the upper order bits of the ripple carry adder may glitch (e.g., gate transition to an incorrect value) before they became stable, consuming dynamic power as the states of downstream circuits change in response. Nevertheless, performing a simulation of random inputs on the logic circuit 72 may show where the highest amount of glitching logic (e.g., logic undergoing gate transitions, signal switching) may occur in the datapath. Registers 78 may then be inserted to subsets of this logic circuit 72 to reduce the overall amount of glitching. This way, a balance between the number of registers 78 and the additional switching power consumption of the registers 78 would be offset with an overall reduction of the dynamic power consumed by the system.

Figures 6, 7:
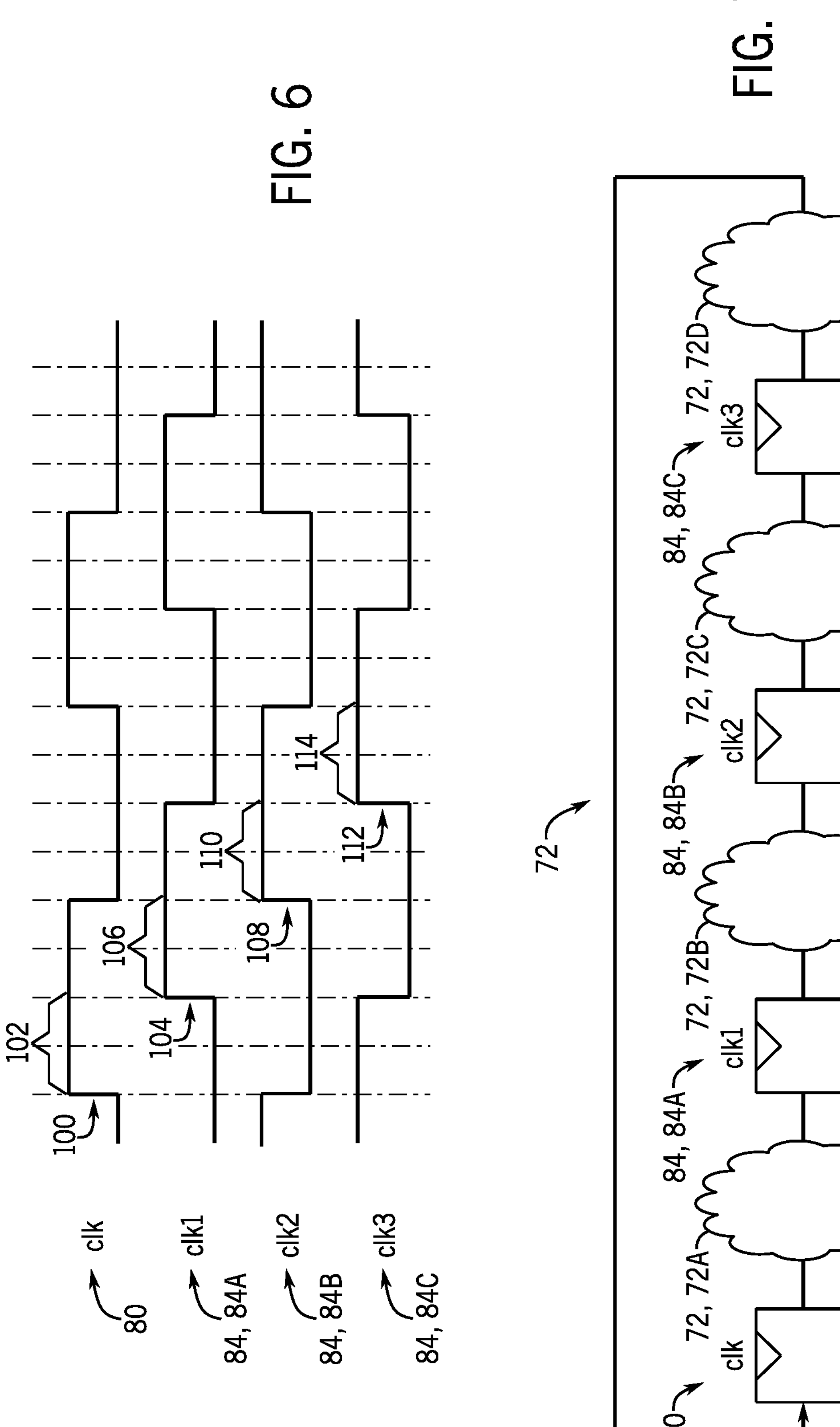
FIG. 6 is an illustration of the main clock and three phase-shifted clocks, in accordance with an embodiment of the present disclosure.
FIG. 7 is a block diagram of a function including logic circuit, a main register, and three registers inserted in the logic circuit, in accordance with an embodiment of the present disclosure.

In an embodiment, the registers 78 may receive a clock signal from phase-shifted clocks. In particular, the faster clock 82 or several faster clocks 82 may be phase-shifted versions of the main clock 80 as show in FIG. 6. This may be used in addition to or as an alternative to having a single faster clock 82 with a particular pulse pattern. FIG. 6 is an illustration of a main clock 80 and three phase-shifted clocks 84. As shown, all the clocks including the main clock 80 and the three phase-shifted clocks 84 (e.g., first phase-shifted clock 84A, second phase-shifted clock 84B, and third phase-shifted clock 84C) have the same period and pulse pattern but different phases.

An illustration of how the clocks with different phases may be applied to a logic circuit 72 is shown in FIG. 7. FIG. 7 is a block diagram of a function 70 that includes a logic circuit 72, a main register 76, and three registers 78 (e.g., pipeline registers) inserted into the logic circuit 72. As discussed, the registers 78 ensure that the later (e.g., downstream) portions of the logic circuit 72 may not consume dynamic power while the earlier portions of the logic circuit 72 are processing the signal. An operation of the logic circuit 72 may include latching the output of the previous iteration of the function 70 on the rising edge 100 of the main clock 80. Then, in the first quarter of the clock period of the main clock 80, indicated by a segment 102, the first portion 72A of the logic circuitry 72 processes the signal (e.g., signal input from the main register 76). Meanwhile, a second portion 72B, a third portion 72C, and a fourth portion 72D of the logic circuit 72 do not have a signal propagating though them, and therefore are not undergoing signal toggling or gate transitions associated with increased dynamic power consumption. On the rising edge 104 of the first phase-shifted clock 84A, the result of the computation associated with the first portion 72A of the logic circuitry 72 is latched by a first register 78A. Then, during the first quarter of the clock cycle of the first phase-shifted clock 84A, indicated by a segment 106, the second portion 72B of the logic circuit 72 is processing the signal. Meanwhile, the third portion 72C and the fourth portion 72D of the logic circuit 72 may be consuming less dynamic power. On the rising edge 108 of the second phase-shifted clock 84B, the result of the computation associated with the second portion 72B of the logic circuit 72 is latched by a second register 78B. Then, during the first quarter of the clock cycle of the second phase-shifted clock 84B, indicated by a segment 110, the result of the third portion 72C of the logic circuit 72 may begin performing computations. Finally, on the rising edge 112 of the third phase-shifted clock 84C, the result of the computation associated with the third portion 72C of the logic circuit 72 is latched by a third register 78C. And during the first quarter of the clock cycle of the third phase-shifted clock 84C, indicated by a segment 114, the result of the last portion 72D of the logic circuit 72 may be computed.

It should be appreciated that the dynamic power consumption advantage associated with insertion of registers 78 into the logic circuit 72 may be achieved when the main clock 80 of the logic circuit 72 has a relatively slow period or when the frequency of the main clock 80 is below a certain threshold. In addition, the dynamic power reduction may be achieved when the logic circuit 72 has a relatively high number (e.g., as compared to an typical or average circuit) of register-to-register paths, relatively deep combinational paths (e.g., paths where relatively many elements, such as LUTs, are processed in sequence), and high LUT switching activity (e.g., relatively many LUTs engaged in computation).

It should be appreciated that, in their simplest form (e.g., with one extra register 78 inserted in the logic circuit 72), the present techniques may reduce the LUT dynamic power consumption by around two times (e.g., by turning off half of the logic circuit 72), while increasing the number of flip-flops by around two times (e.g., by adding an extra pipeline stage). Thus, the overall dynamic power reduction may occur if LUT power reduction is larger than flip-flop power growth. Accordingly, overall dynamic power reduction (e.g., through insertion of one register 78) may be achieved in when the dynamic power consumption of the LUTs of the logic circuit 72 is at least twice the dynamic power consumption of the flip-flip flops of the logic circuit 72. In addition, the present techniques are applicable if there is at least two LUTs in the signal propagation path inside the logic circuit 72.

While the present disclosure discusses adding clocks (e.g., faster clocks 82 or phase-shifted clocks 84) to a combinational circuit design to reduce its dynamic power consumption, the methods discussed herein may be applied a circuit design that is already pipelined. In particular, the pipelined circuit may be pipelined deeper (e.g., by adding more pipeline stages) using the methods described in this disclosure (e.g., utilizing faster clocks 82 or phase-shifted clocks 84).

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENTS

Example Embodiment 1

An integrated circuit comprising: programmable logic circuitry configurable to be processed combinatorially; main register configurable to receive an output of the programmable logic circuitry and configurable to receive a first clock signal; and a first register that splits the programmable logic circuitry into a first portion and a second portion, wherein the first register is configurable to receive a pulse of a second clock signal and wherein the pulse is configurable to arrive at the first register at a time that reduces an amount of dynamic power consumed by the second portion of the programmable logic circuitry prior to arrival of the pulse at the first register.

Example Embodiment 2

The integrated circuit of example embodiment 1, wherein the first register is configurable to latch a first intermediate result of the first portion based on receiving the pulse of the second clock signal.

Example Embodiment 3

The integrated circuit of example embodiment 1, comprising a second register that splits the programmable logic circuitry into a third portion and a fourth portion, wherein the second register is configurable to receive the first clock signal and to latch a second intermediate result of the third portion on a negative edge of the first clock signal, and wherein the fourth portion does not receive an input until the second intermediate result has been latched by the second register.

Example Embodiment 4

The integrated circuit of example embodiment 1, wherein the second clock signal comprises a phase-shifted first clock signal.

Example Embodiment 5

The integrated circuit of example embodiment 1, wherein a pulse sequence of the second clock signal has a pulse pattern that varies throughout a period of the first clock.

Example Embodiment 6

The integrated circuit of example embodiment 1, wherein one cycle of the first clock signal comprises multiple pulses of the second clock signal.

Example Embodiment 7

The integrated circuit of example embodiment 1, wherein the logic circuitry comprises at least two lookup tables (LUTs), flip-flops, or both, and wherein a dynamic power consumption of the at least two LUTs is at least twice the dynamic power consumption of the flip-flops excluding the flip-flops associated with the first register.

Example Embodiment 8

The integrated circuit of example embodiment 1, comprising a third clock signal that has a different duty cycle from the second clock signal, wherein at least one clock edge of the third clock signal occurs simultaneously with at least one clock edge of the second clock signal.

Example Embodiment 9

The integrated circuit of example embodiment 1, wherein the main register is configurable to provide an input to the programmable logic circuitry.

Example Embodiment 10

A method comprising: receiving a first clock signal via a main register, wherein the main register is configurable to receive an output of programmable logic circuitry; receive a first pulse of a second clock signal via a first register that splits the programmable logic circuitry into a first portion and a second portion, wherein the second portion consumes less dynamic power prior to the first register receiving the first pulse than the second portion would consume without the first register preceding it in a signal propagation path; and receiving a second pulse of the second clock signal via a second register.

Example Embodiment 11

The method of example embodiment 10, comprising latching a second intermediate result of the programmable logic circuitry via the second register at the second pulse.

Example Embodiment 12

The method of example embodiment 10, comprising receiving the first clock signal via a third register and latching a third intermediate result of the programmable logic circuitry on a negative edge of the first clock signal.

Example Embodiment 13

The method of example embodiment 10, wherein the second clock signal comprises a phase-shifted first clock signal.

Example Embodiment 14

The method of example embodiment 10, wherein multiple pulses of the second clock signal occur during a single period of the first clock signal.

Example Embodiment 15

The method of example embodiment 10, wherein a period of the second clock signal is different from the period of the first clock signal.

Example Embodiment 16

The method of example embodiment 10, wherein the first pulse of the second clock signal is configurable to arrive at the first register at a time that minimizes an amount of dynamic power consumed by the second portion of the programmable logic circuitry.

Example Embodiment 17

The method of example embodiment 10, wherein the logic circuitry comprises at least two lookup tables (LUTs), flip-flops, or both, and wherein a dynamic power consumption of the at least two LUTs is at least twice the dynamic power consumption of the flip-flops excluding the flip-flops associated with the first register.

Example Embodiment 18

The method of example embodiment 10, comprising a third clock signal that has a different duty cycle from the second clock signal, wherein at least one clock edge of the third clock signal occurs simultaneously with at least one clock edge of the first clock signal.

Example Embodiment 19

One or more tangible, non-transitory, computer-readable media, comprising instructions that cause processing circuitry to generate a bitstream to: configure a main register of a programmable logic device to receive a first clock signal via the main register, wherein the main register is configurable to receive an output of programmable logic circuitry of the programmable logic device; configure a first register inserted into the programmable logic circuitry to receive a pulse of a second clock signal via the first register inserted into the programmable logic circuitry, wherein the programmable logic circuitry downstream of the first register along a signal propagation path consumes less dynamic power prior to receiving the pulse than after than receiving the pulse; and configure the first register to latch an intermediate result of the programmable logic circuitry via the first register on a rising edge of the pulse.

Example Embodiment 20

The one or more tangible, non-transitory, computer-readable media of example embodiment 19, wherein the main register is configurable to provide an input to the programmable logic circuitry.

What is claimed is:

1. An integrated circuit comprising:
- programmable logic circuitry configurable to be processed combinationally;
- a main register configurable to receive an output of the programmable logic circuitry and configurable to receive a first clock signal; and
- a first register that splits the programmable logic circuitry into a first portion and a second portion, wherein the first register is configurable to receive a pulse of a second clock signal and wherein the pulse is configurable to arrive at the first register at a time that reduces an amount of dynamic power consumed by the second portion of the programmable logic circuitry prior to arrival of the pulse at the first register.

2. The integrated circuit of claim 1, wherein the first register is configurable to latch a first intermediate result of the first portion based on receiving the pulse of the second clock signal.

3. The integrated circuit of claim 1, comprising a second register that splits the programmable logic circuitry into a third portion and a fourth portion, wherein the second register is configurable to receive the first clock signal and to latch a second intermediate result of the third portion on a negative edge of the first clock signal, and wherein the fourth portion does not receive an input until the second intermediate result has been latched by the second register.

4. The integrated circuit of claim 1, wherein the second clock signal comprises a phase-shifted first clock signal.

5. The integrated circuit of claim 1, wherein a pulse sequence of the second clock signal has a pulse pattern that varies throughout a period of the first clock without a constant frequency.

6. The integrated circuit of claim 1, wherein one cycle of the first clock signal comprises multiple pulses of the second clock signal.

7. The integrated circuit of claim 1, wherein the logic circuitry comprises at least two lookup tables (LUTs), flip-flops, or both, and wherein a dynamic power consumption of the at least two LUTs is at least twice the dynamic power consumption of the flip-flops excluding the flip-flops associated with the first register.

8. The integrated circuit of claim 1, comprising a third clock signal that has a different duty cycle from the second clock signal, wherein at least one clock edge of the third clock signal occurs simultaneously with at least one clock edge of the second clock signal.

9. The integrated circuit of claim 1, wherein the main register is configurable to provide an input to the programmable logic circuitry.

10. A method comprising:
- receiving a first clock signal via a main register, wherein the main register is configurable to receive an output of programmable logic circuitry;
- receiving a first pulse of a second clock signal via a first register that splits the programmable logic circuitry into a first portion and a second portion, wherein the second portion consumes less dynamic power prior to the first register receiving the first pulse than the second portion would consume without the first register preceding it in a signal propagation path; and
- receiving a second pulse of the second clock signal via a second register in the signal propagation path.

11. The method of claim 10, comprising latching a second intermediate result of the programmable logic circuitry via the second register at the second pulse.

12. The method of claim 10, comprising receiving the first clock signal via a third register and latching a third intermediate result of the programmable logic circuitry on a negative edge of the first clock signal.

13. The method of claim 10, wherein the second clock signal comprises a phase-shifted first clock signal.

14. The method of claim 10, wherein multiple pulses of the second clock signal occur during a single period of the first clock signal.

15. The method of claim 10, wherein a period of the second clock signal is different from the period of the first clock signal.

16. The method of claim 10, wherein the first pulse of the second clock signal is configurable to arrive at the first register at a time that minimizes an amount of dynamic power consumed by the second portion of the programmable logic circuitry.

17. The method of claim 10, wherein the logic circuitry comprises at least two lookup tables (LUTs), flip-flops, or both, and wherein a dynamic power consumption of the at least two LUTs is at least twice the dynamic power consumption of the flip-flops excluding the flip-flops associated with the first register.

18. The method of claim 10, comprising a third clock signal that has a different duty cycle from the second clock signal, wherein at least one clock edge of the third clock signal occurs simultaneously with at least one clock edge of the first clock signal.

19. One or more tangible, non-transitory, computer-readable media, comprising instructions that cause processing circuitry to generate a bitstream to:

configure a main register of a programmable logic device to receive a first clock signal via the main register, wherein the main register is configurable to receive an output of programmable logic circuitry of the programmable logic device;

configure a first register inserted into the programmable logic circuitry to receive a pulse of a second clock signal via the first register inserted into the programmable logic circuitry, wherein the programmable logic circuitry downstream of the first register along a signal propagation path consumes less dynamic power prior to receiving the pulse than after than receiving the pulse; and configure the first register to latch an intermediate result of the programmable logic circuitry via the first register on a rising edge of the pulse.

20. The one or more tangible, non-transitory, computer-readable media of claim 19, wherein the main register is configurable to provide an input to the programmable logic circuitry.

* * * * *